US009093509B2

(12) United States Patent
Heo et al.

(10) Patent No.: US 9,093,509 B2
(45) Date of Patent: Jul. 28, 2015

(54) GRAPHENE ELECTRONIC DEVICES

(75) Inventors: Jin-seong Heo, Suwon-si (KR); Sun-ae Seo, Hwaseong-si (KR); Sung-hoon Lee, Hwaseong-si (KR); Hyun-jong Chung, Hwaseong-si (KR); Hee-jun Yang, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 211 days.

(21) Appl. No.: 13/242,177

(22) Filed: Sep. 23, 2011

(65) Prior Publication Data

US 2012/0132893 A1 May 31, 2012

(30) Foreign Application Priority Data

Nov. 30, 2010 (KR) ........................ 10-2010-0120614

(51) Int. Cl.

*H01L 29/06* (2006.01)
*H01L 29/778* (2006.01)
*H01L 29/16* (2006.01)

(52) U.S. Cl.

CPC .......... *H01L 29/778* (2013.01); *H01L 29/0657* (2013.01); *H01L 29/1606* (2013.01)

(58) Field of Classification Search

CPC .................... H01L 29/1606; H01L 29/66015; H01L 2924/13088; H01L 29/06; H01L 29/0657; H01L 29/0665; H01L 29/778; B82B 3/0014; B82B 3/0066

USPC .................................... 257/29, 613; 977/734

See application file for complete search history.

(56) References Cited

U.S. PATENT DOCUMENTS

| | | | | |
|---|---|---|---|---|
| 6,869,581 | B2 | 3/2005 | Kishi et al. | |
| 7,736,741 | B2 | 6/2010 | Maruyama et al. | |
| 2003/0098640 | A1 | 5/2003 | Kishi et al. | |
| 2009/0020399 | A1 | 1/2009 | Kim et al. | |
| 2009/0174435 | A1 | 7/2009 | Stan et al. | |
| 2010/0127243 | A1 | 5/2010 | Banerjee et al. | |
| 2010/0127312 | A1* | 5/2010 | Grebel et al. | 257/288 |
| 2010/0258787 | A1 | 10/2010 | Chae et al. | |
| 2010/0327847 | A1 | 12/2010 | Leiber et al. | |
| 2011/0220865 | A1 | 9/2011 | Miyata et al. | |
| 2011/0244661 | A1 | 10/2011 | Dai et al. | |
| 2012/0112250 | A1 | 5/2012 | Chung et al. | |

(Continued)

FOREIGN PATENT DOCUMENTS

| | | |
|---|---|---|
| KR | 2009-0009049 A | 1/2009 |
| KR | 20090065206 A | 6/2009 |

(Continued)

OTHER PUBLICATIONS

Bai et al., "Graphene nanomesh", Nature Nanotechnology 5 (2010) pp. 190-194.*

(Continued)

*Primary Examiner* — Jay C Kim

(74) *Attorney, Agent, or Firm* — Harness, Dickey & Pierce, P.L.C.

(57) ABSTRACT

A graphene electronic device includes a gate electrode, a gate oxide disposed on the gate electrode, a graphene channel layer formed on the gate oxide, and a source electrode and a drain electrode respectively disposed on both ends of the graphene channel layer. In the graphene channel layer, a plurality of nanoholes are arranged in a single line in a width direction of the graphene channel layer.

8 Claims, 4 Drawing Sheets

142 150 132 130 144 100 120 110

142 120 130 144 I I' W 132

(56) References Cited

U.S. PATENT DOCUMENTS

| | | | |
|---|---|---|---|
| 2012/0168722 | A1 | 7/2012 | Chung et al. |
| 2012/0248414 | A1 | 10/2012 | Kim et al. |
| 2014/0014905 | A1 | 1/2014 | Lee et al. |

FOREIGN PATENT DOCUMENTS

| | | | |
|---|---|---|---|
| KR | 20090129298 | A | 12/2009 |
| KR | 2010-0016928 | A | 2/2010 |
| KR | 20100016929 | A | 2/2010 |
| KR | 20100111999 | A | 10/2010 |
| KR | 2010-0121731 | A | 11/2010 |
| KR | 2011-0081683 | A | 7/2011 |
| KR | 2012-0015290 | A | 2/2012 |
| KR | 2012-0048241 | A | 5/2012 |
| KR | 2012-0076061 | A | 7/2012 |
| KR | 2013-0022854 | A | 3/2013 |

OTHER PUBLICATIONS

Liang et al., “Formation of Bandgap and Subbands in Graphene Nanomeshes with Sub-10 nm Ribbon Width Fabricated via Nanoimprint Lithography”, Nano Letters 10 (2010) pp. 2454-2460.*

Melinda Y. Han et al., “Electron transport in Disordered Graphene Nanoribbons,” *Phys. Rev. Ltrs*., The Am. Phys. Soc., vol. 104, 056801-1-056801-4 (Feb. 5, 2010).

Jingwei Bai et al., “Graphene nanomesh,” *Nature Nanotechnology*, vol. 5, pp. 190-194 (Mar. 2010).

Thomas G. Pedersen et al., “Graphene Antidot Lattices—Designed Defects and Spin Qubits” arXiv:0802.4019v1, Feb. 27, 2008, whole document.

K. Novoselov et al. “Electric Field Effect in Atomically Thin Carbon Films”; Science, vol. 306, p. 666-669; Oct. 22, 2004.

Office Action for corresponding U.S. Appl. No. 13/772,693 dated Aug. 6, 2014.

* cited by examiner

GRAPHENE ELECTRONIC DEVICES

CROSS-REFERENCE TO RELATED APPLICATIONS

This application claims priority under 35 U.S.C. §119 to Korean Patent Application No. 10-2010-0120614, filed on Nov. 30, 2010, in the Korean Intellectual Property Office (KIPO), the entire contents of which is incorporated herein by reference.

BACKGROUND

1. Field

Example embodiments relate to graphene electronic devices.

2. Description of the Related Art

Graphene with a 2-dimensional hexagonal carbon structure is a new material that may replace semiconductors. Graphene is generally a zero gap semiconductor with a carrier mobility of 100,000 $cm^2V^{-1}s^{-1}$ at room temperature, which is approximately 100 times faster than that of conventional silicon. Therefore, graphene may be applied to devices that operate at high speed, for example, radio frequency (RF) devices.

When graphene is formed as a graphene nano-ribbon (GNR) with a channel width of less than 10 nm, a band-gap exists due to a size effect. A field effect transistor may be manufactured using a GNR. Graphene electronic devices, for example, field effect transistors and/or RF transistors, are examples of electronic devices that include graphene.

In a process of manufacturing a GNR by patterning a graphene sheet, an edge of the GNR may be non-uniform. As a result, the carrier mobility of a transistor that includes the GNR as a channel layer may be reduced, thereby reducing the performance of the transistor.

SUMMARY

According to example embodiments, graphene electronic devices may include graphene channel layers with nanoholes.

According to some example embodiments, a graphene electronic device may include a gate electrode, a gate oxide disposed on the gate electrode, a graphene channel layer formed on the gate oxide, and a source electrode and a drain electrode respectively disposed on both ends of the graphene channel layer. The graphene channel layer includes a plurality of nanoholes.

The gate electrode may be a silicon substrate. The nanoholes may form a single line in a width direction of the graphene channel layer. The nanoholes may be disposed substantially perpendicular to the length direction of the graphene channel layer. The nanoholes may be slantly disposed with respect to the length direction of the graphene channel layer. The nanoholes may be disposed in a zigzag shape in a width direction of the graphene channel layer. Each of the nanoholes may have a diameter in a range of about 1 nm to about 20 nm. The nanoholes may be arranged with gaps in a range of about 1 nm to about 20 nm. The graphene channel layer may have a width in a range of about 100 nm to about 5 μm. The graphene channel layer may include a single layer of graphene or bi-layers of graphene.

According to other example embodiments, a graphene electronic device includes a substrate, a graphene channel layer formed on the substrate, a source electrode and a drain electrode respectively disposed on both ends of the graphene channel layer, a gate oxide layer covering the graphene channel layer; and a gate electrode formed on the gate oxide layer. The graphene channel layer includes a plurality of nanoholes.

According to at least one example embodiment, a graphene electronic device includes a gate electrode, a gate insulator on the gate electrode, a graphene channel layer including a plurality of nanoholes on the gate insulator, and a source electrode and a drain electrode on the graphene channel layer.

According to at least one example embodiment, a graphene electronic device includes a substrate, a graphene channel layer including a plurality of nanoholes on the substrate, a source electrode and a drain electrode on the graphene channel layer, a gate insulating layer on the graphene channel layer and a gate electrode on the gate insulating layer.

BRIEF DESCRIPTION OF THE DRAWINGS

Example embodiments will be more clearly understood from the following brief description taken in conjunction with the accompanying drawings.

FIG. 1 is a schematic cross-sectional diagram illustrating graphene electronic devices according to some example embodiments;

FIG. 2 is a plan diagram illustrating a graphene electronic device of FIG. 1;

FIGS. 3 and 4 are plan diagrams illustrating graphene channel layers according to other example embodiments;

FIG. 5 is a graph illustrating a performance curve of a field effect transistor according to at least one example embodiment;

FIG. 6 is a schematic cross-sectional diagram illustrating a structure of a graphene electronic device according to further example embodiments; and FIG. 7 is a plan diagram illustrating a graphene electronic device of FIG. 6.

Figure 1:
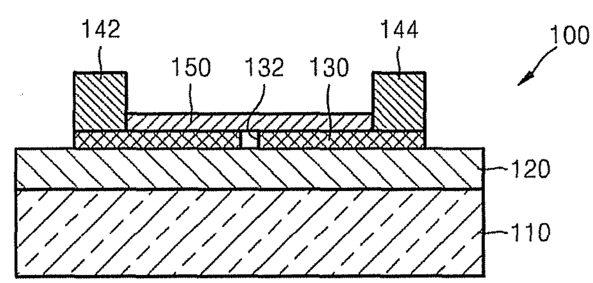
FIGS. 1-7 represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments will now be described more fully with reference to the accompanying drawings, in which example embodiments are shown. Example embodiments may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being “connected” or “coupled” to another element, it can be directly connected or coupled to the other element or intervening elements may be present. In contrast, when an element is referred to as being “directly connected” or “directly coupled” to another element, there are no intervening elements present. Like numbers indicate like elements throughout. As used herein the term “and/or” includes any and all combinations of one or more of the associated listed items. Other words used to describe the relationship between elements or layers should be interpreted in a like fashion (e.g., “between” versus “directly between,” “adjacent” versus “directly adjacent,” “on” versus “directly on”).

It will be understood that, although the terms “first”, “second”, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as “beneath,” “below,” “lower,” “above,” “upper” and the like, may be used herein for ease of description to describe one element or feature’s relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as “below” or “beneath” other elements or features would then be oriented “above” the other elements or features. Thus, the exemplary term “below” can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms “a,” “an” and “the” are intended to include the plural forms as well, unless the context clearly indicates otherwise. It will be further understood that the terms “comprises”, “comprising”, “includes” and/or “including,” if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
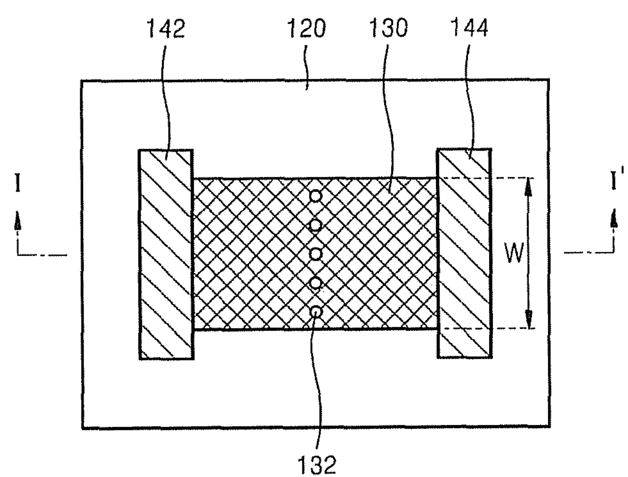

FIG. 1 is a schematic cross-sectional diagram illustrating a graphene electronic device 100 according to some example embodiments. FIG. 2 is a plan diagram illustrating a graphene electronic device of FIG. 1. FIG. 1 is a cross-sectional diagram taken along line I-I' of FIG. 2. For convenience of illustration, a passivation layer 150 illustrated in FIG. 1 may be omitted in FIG. 2. Referring to FIG. 1, a gate insulating layer 120 (e.g., an oxide) may be on a substrate 110. The gate insulating layer 120 may be, for example, a silicon oxide with a thickness of about 100 nm to about 300 nm. The substrate 110 may be a conductive substrate and may be referred to as a gate electrode. The substrate 110 may be a silicon substrate. Example embodiments are not limited to a silicon substrate and a conductive substrate of a material other than silicon may be used instead as a substrate 110.

A graphene channel layer 130 may be on the insulating layer 120. The graphene channel layer 130 may be a single layer of graphene and/or bi-layers of graphene. The graphene channel layer 130 may be multiple layers of graphene without limitation. Referring to FIGS. 1 and 2, a plurality of nanoholes 132 may be arranged in the graphene channel layer 130 in a width direction of the graphene channel layer 130. The nanoholes 132 may be in a line. The nanoholes 132 may be, for example, disposed substantially perpendicular to a length direction of the graphene channel layer 130. The nanoholes 132 may be formed by, for example, using an electron beam lithography method and/or a focused ion beam method when patterning the graphene.

Although FIG. 1 illustrates circular nanoholes 132, according to example embodiments, various shapes are contemplated. For example, the nanoholes 132 may be hexagonal, square and/or triangular. Although FIG. 1 illustrates nanoholes 132 passing completely through a graphene channel layer 130, example embodiments are not so limited and a nanohole 132 may partially penetrate the graphene channel layer 130. For example, the graphene channel layer 130 may be recessed.

A diameter of each of the nanoholes 132 may be about 1 nm to about 20 nm. Regions between the nanoholes 132 may be about 1 nm to about 20 nm. For example, a distance between nanoholes may be about 1 nm to about 20 nm. When the regions of graphene between the nanoholes 132 are less than 1 nm, the adjacent nanoholes 132 may overlap due to process variation. When the regions are greater than 20 nm, a band-gap induced by a size effect may not exist. When regions between the nanoholes 132 are small, a band-gap (e.g., a non-zero band-gap) of the graphene of the graphene channel layer 130 may exist due to a size effect similarly to the size effect exhibited by a graphene nano-ribbon (GNR). The graphene channel layer 130 may exhibit semiconductor characteristics.

A width W of the graphene channel layer 130 may be about 100 nm to about 5 μm. Because a width of the graphene channel layer 130 may be relatively larger than that of a GNR, damage to the graphene channel layer 130 during patterning may be reduced. A source electrode 142 and a drain electrode 144 may be respectively formed on both ends of the graphene channel layer 130. A passivation layer 150 may be on the graphene channel layer 130 between the source electrode 142 and the drain electrode 144. The passivation layer 150 may include, for example, silicon oxide. A thickness of the passivation layer 150 may be about 5 nm to about 30 nm.

A graphene electronic device 100 of FIG. 1 may be a back-gate type field effect transistor. A field effect transistor 100 including a graphene channel layer 130 may be operated at room temperature.

Figure 3:
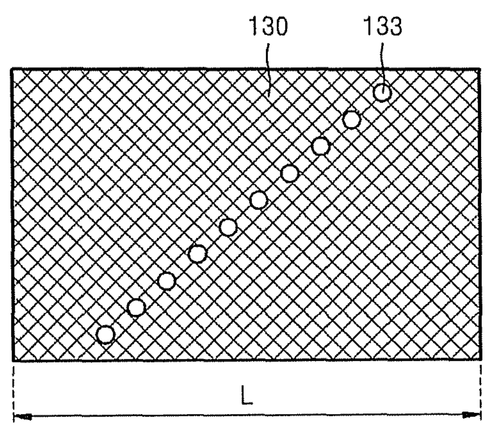
Figure 4:
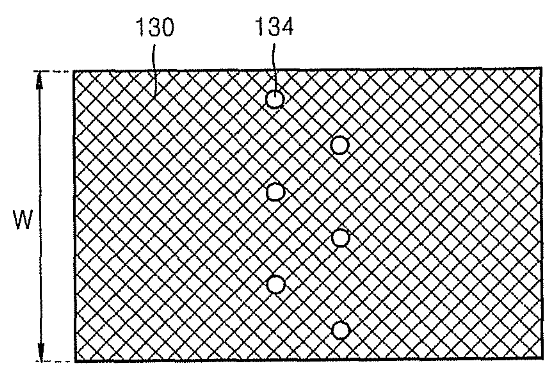

FIGS. 3 and 4 are plan diagrams illustrating graphene channel layers according to other example embodiments. Like reference numerals are used to indicate elements that are substantially identical to the elements of FIGS. 1 and 2, and a description thereof may not be repeated. Referring to FIG. 3, nanoholes 133 may be slanted with respect to a length L (e.g., a channel length) direction of the graphene channel layer 130. Referring to FIG. 4, nanoholes 134 may be arranged in a zigzag pattern in a width W direction of the graphene channel layer 130. Example embodiments include any distribution of nanoholes that, for example, result in a semiconducting graphene channel layer 130.

Figure 5:
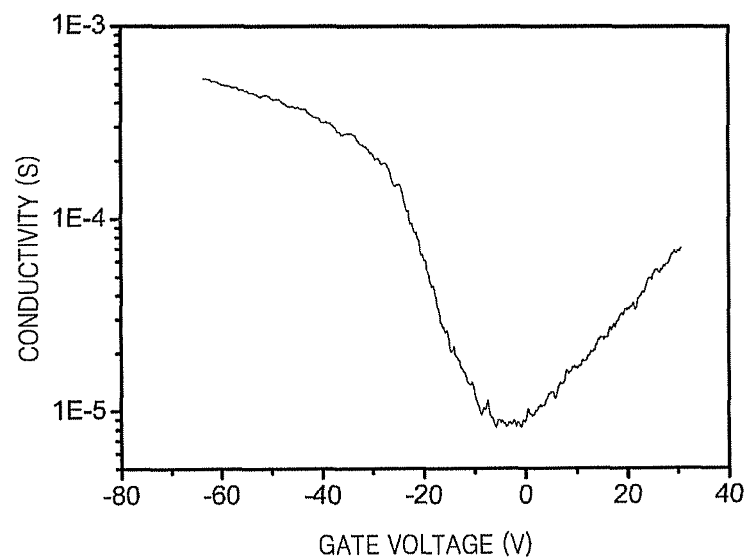

FIG. 5 is a graph illustrating a performance curve of a field effect transistor manufactured according to at least one example embodiment. Referring to FIG. 5, an ON/OFF ratio of a field effect transistor may be greater than about 100, which may be a high and/or improved ratio. A mobility of the field effect transistor may be a favorable and/or improved mobility of about 1,000 $cm^2/Vs$. In a graphene field effect transistor according to at least one example embodiment, nanoholes may be formed in a graphene channel layer with narrow regions of graphene between the nanoholes. Similarly to a GNR, the graphene channel layer may exhibit semiconductor characteristics. Because the width of the graphene channel layer may be relatively large and/or increased, it may be possible to prevent the reduction of performance of the graphene channel layer due to a graphene patterning process.

Figure 6:
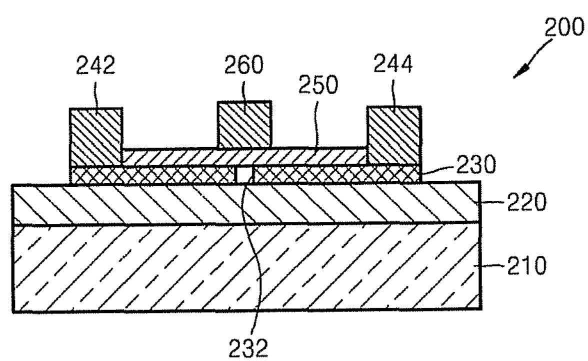
Figure 7:
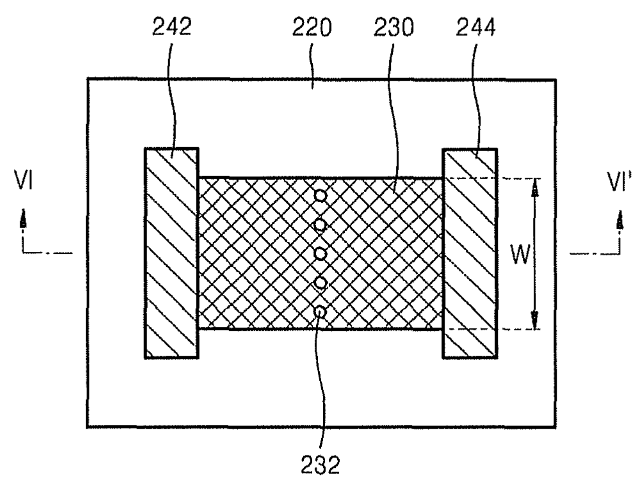

FIG. 6 is a schematic cross-sectional diagram illustrating the structure of a graphene electronic device 200 according to further example embodiments. FIG. 7 is a plan diagram illustrating the graphene electronic device 200 of FIG. 6. FIG. 6 is a cross-sectional diagram taken along line VI-VI' of FIG. 7. For convenience of illustration, a gate electrode 260 and a gate insulating layer 250 on a graphene channel layer 230 are omitted in FIG. 7. Referring to FIG. 6, an insulating layer 220 may be on a substrate 210 (e.g., a silicon substrate). The insulating layer 220 may be, for example, a silicon oxide. A thickness of the insulating layer 220 may be about 100 nm to about 300 nm. A graphene channel layer 230 may be on the insulating layer 220. The graphene channel layer 230 may be a single layer of graphene or bi-layers of graphene. The graphene channel layer 230 may be multiple layers without limitation.

Referring to FIGS. 6 and 7, a plurality of nanoholes 232 may be arranged in the graphene channel layer 230 in, for example, a width direction of the graphene channel layer 230. The nanoholes 232 may be in a line. The nanoholes 232 may be disposed substantially perpendicular to a length direction of the graphene channel layer 230. The nanoholes 232 may be arranged in a line and slanted with respect to the length direction of the graphene channel layer 230 (not shown). The nanoholes 232 may be arranged in a zigzag pattern (not shown). Example embodiments include any distribution of nanoholes 232 that, for example, result in a semiconducting graphene channel layer 130.

A diameter of each of the nanoholes 232 may about 1 nm to about 20 nm. Regions between the nanoholes 232 may be about 1 nm to about 20 nm. Because the regions of graphene between the nanoholes 232 may be narrow, a band-gap may arise in the graphene of the graphene channel layer 230 due to a size effect. Characteristics of the graphene channel layer 230 may be semiconductor characteristics. A width W of the graphene channel layer 230 may be about 100 nm to about 5 μm. Because a width of the graphene channel layer 230 is relatively greater than that of a GNR, edge damage to the graphene channel layer 230 may be reduced when a graphene layer (not shown) is patterned.

A source electrode 242 and a drain electrode 244 may be on opposite ends of the graphene channel layer 230. A gate insulating layer 250 may be on the graphene channel layer 230 between the source electrode 242 and the drain electrode 244. The gate insulating layer 250 may include an oxide, for example, a silicon oxide. A gate electrode 260 may be on the gate insulating layer 250. The gate electrode 260 may include a metal, for example, aluminum.

The graphene electronic device 200 of FIGS. 6 and 7 may be a top gate type field effect transistor. The field effect transistor 200 including graphene as a channel may be operated at room temperature.

A graphene electronic device according to example embodiments may include a plurality of nanoholes in a graphene channel layer. Similarly to a GNR, characteristics of a graphene electronic device may be semiconductor characteristics. Because a width of the graphene channel layer may be relatively large and/or increased, it may be possible to prevent a reduction of performance of the channel layer due to a graphene patterning process used to form a graphene channel layer. Mobility of the graphene channel layer may be increased.

While example embodiments have been particularly shown and described, it will be understood by one of ordinary skill in the art that variations in form and detail may be made therein without departing from the spirit and scope of the claims.

What is claimed is:

1. A graphene electronic device, comprising:
a gate electrode;
a gate insulating layer on the gate electrode;
a graphene channel layer on the gate insulating layer,
the graphene channel layer including a plurality of nanoholes arranged in a line pattern that extends along a width direction of the graphene channel layer and is substantially perpendicular to a length direction of the graphene channel layer,
the plurality of nanoholes being entire nanoholes of substantially a same size included in the graphene channel layer; and
a source electrode and a drain electrode spaced apart in the length direction on the graphene channel layer.

2. The graphene electronic device of claim 1, wherein the gate electrode is a silicon substrate.

3. The graphene electronic device of claim 1, wherein a width of the graphene channel layer is about 100 nm to about 5 μm.

4. The graphene electronic device of claim 1, wherein a diameter of each of the plurality of the nanoholes is about 1 nm to about 20 nm.

5. The graphene electronic device of claim 4, wherein the plurality of the nanoholes are separated by a distance of about 1 nm to about 20 nm.

6. The graphene electronic device of claim 1, wherein the graphene channel layer includes one of a single layer of graphene and bi-layers of graphene.

7. The graphene electronic device of claim 1, wherein each one of the plurality of nanoholes is spaced apart from the source electrode by a same distance.

8. The graphene electronic device of claim 1, wherein the entire nanoholes are aligned in a center region of the graphene channel layer.

* * * * *